LOGIC CIRCUIT

Filed May 17, 1961

INVENTORS.
ALLEN L. SOLOMON
MOE S. WASSERMAN
BY R. J. Frank
ATTORNEY

United States Patent Office 3,215,845

Patented Nov. 2, 1965

3,215,845

LOGIC CIRCUIT

Allen L. Solomon, Glen Cove, and Moe S. Wasserman, Massapequa, N.Y., assignors to General Telephone and Electronics Laboratories, Inc., a corporation of Delaware Filed May 17, 1961, Ser. No. 110,697

7 Claims. (Cl. 250—209)

This invention relates to logic circuits and in particular to logic circuits employing electroluminescent and photoconductive elements.

Logic circuits, in the form of "and" and "or" gates, find wide application in code translators and other types of computing equipment. An "and" gate may be defined as a logic circuit having a plurality of inputs and a single output which transmits a signal only when all of its inputs are simultaneously energized. An "or" gate is a logic circuit having a plurality of inputs and a single output which transmits a signal when any one or more of its inputs are energized.

Electroluminescent and photoconductive elements have been employed in various forms of logic circuits. An electroluminescent element generally comprises a phosphor layer or film which emits light when in the presence of an electrical field while a photoconductive element is an element having a high electrical impedance in the dark and a low electrical impedance when illuminated. These circuits are generally designed to respond to applied input signals in a fixed and predetermined manner; that is, once manufactured, their response to input signals cannot be altered by external means. However, many military and commercial applications exist in which it is desirable to have a logic circuit that can be easily and quickly adjusted to accept a variety of coded input signals.

Accordingly, it is an object of our invention to provide an improved logic circuit having a response to applied input signals which can be easily and quickly modified when desired.

It is another object of the invention to provide a logic circuit using electroluminescent and photoconductive elements having a response to applied input signals which can be varied electrically without the use of optical masks or similar mechanical devices.

Still another object is to provide logic circuits which are inexpensive, easy to produce, and are sufficiently flexible to permit their use in a large number of applications.

A further object is to provide logic circuits in which the input and output circuits may be optically coupled but electrically isolated.

Yet another object is to provide "and" and "or" gates using electroluminescent and photoconductive elements which can be adjusted to respond to a variety of coded input signals.

In the present invention, a logic circuit is provided which comprises a plurality of individual logic stages each composed of electroluminescent and photoconductive elements. Each of the logic stages consists of first and second electroluminescent elements optically coupled to first and second photoconductive elements respectively. The first electroluminescent element and the first photoconductive element are electrically coupled in series across a voltage source while the second electroluminescent element is electrically coupled across the voltage source by an input switch. One end of the second photoconductive element is connected to the junction of the first electroluminescent element and the first photoconductive element while the other end is arranged to be selectively connected to the voltage source. Output photoconductive elements in each stage are optically coupled to the first and second electroluminescent elements and are electrically coupled to a load.

When the logic circuit is used as an "and" gate, the output photoconductive element in each stage is connected in series with the output photoconductive elements in each of the other stages. In this way, the load is energized only when the output photoconductive elements in all of the stages are illuminated.

In operation, certain selected output photoconductive elements are maintained in their low impedance state by light from the corresponding first electroluminescent elements regardless of the positions of the associated input switches. The remainder of the output photoconductive elements have their impedances reduced only when the associated input switches are closed and they are illuminated by light emitted by the second electroluminescent elements. Thus, the load is energized only when all of the switches in the latter group have been closed regardless of the positions of the switches in the first group.

For example, in an "and" circuit having a plurality of stages it may be desired to have the load energized only when input signals are applied to the first, third, and fifth stages. In such a case, the first electroluminescent elements associated with all stages, except the first, third, and fifth would be maintained in their energized condition thereby illuminating the output photoconductive elements associated with these stages and lowering their impedances. When the input switches in the first, third and fifth stages are open, the output photoconductive elements in these stages are dark, their impedances are high, and the flow of load current is effectively prevented. When the input switches in the first, third and fifth stages are closed all of the output photoconductive elements in all of the stages are illuminated. As a result, all of the output photoconductive elements have low impedances and current flows through the load.

The "and" gate may be reset to respond to a different set of input signals by first energizing the first electroluminescent elements in all of the stages and then deenergizing the electroluminescent elements in only those stages which will receive the input signal. All of the first electroluminescent elements are turned on by connecting the other end of the second photoconductive element in each stage to the voltage source and then momentarily closing all of the input switches. Closing the input switches energizes the second electroluminescent element in each stage thereby illuminating the associated second photoconductive elements. As a result, the first electroluminescent elements are energized through the low impedances of the illuminated second photoconductive elements and are maintained in the energized state by the low impedance of the illuminated first photoconductive elements.

The desired response is set into the "and" gate by grounding the other ends of each of the second photoconductive elements and then momentarily closing only these input switches which correspond to the new input signal. Closing the selected input switches energizes the second electroluminescent elements in the associated stages causing the second photoconductive elements to be illuminated thereby lowering the potential across the first electroluminescent elements in the selected stage and extinguishing them. The second photoconductive elements are next disconnected from the voltage source and the circuit is ready for normal operation.

When the logic circuit is used as an "or" gate, two series-connected output photoconductive elements are provided in each stage. The series-connected output photoconductive elements in each stage are connected in parallel with the output photoconductive elements in the other stages and in series with the load. Thus, when both output photoconductive elements in any one stage are illuminated, the load is energized. As will be explained hereinafter, the procedure for setting a new code into the "or" gate is similar to that used in setting the "and" gate.

The above objects of and the brief introduction to the present invention will be more fully understood and further objects and advantages will become apparent from a study of the following description in connection with the drawings, wherein.

Figure 1:
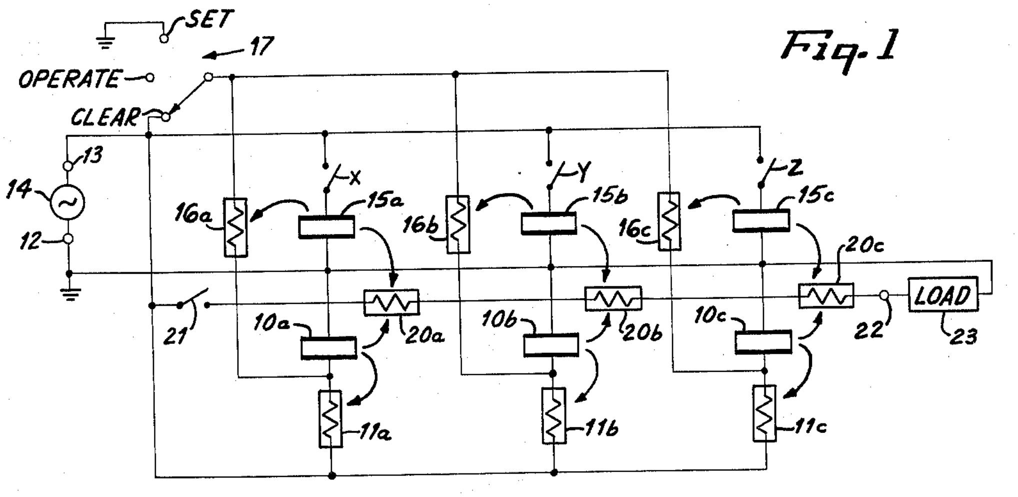
FIG. 1 is a schematic diagram of an "and" gate employing our invention.

Referring to FIG. 1, there is shown a logic circuit in the form of an "and" gate comprising three stages. For simplicity, only three stages have been shown although it will be appreciated that the circuit may have as many stages as are required for a particular application.

In the circuit of FIG. 1, a first set of electroluminescent elements or cells 10*a*, 10*b*, and 10*c* are optically coupled to a first set of photoconductive elements (hereinafter termed photoconductors) 11*a*, 11*b*, and 11*c*, respectively. Optical coupling is indicated by the arrows extending from the electroluminescent cells to the photoconductors. Each of the electroluminescent cells 10*a*–10*c* is electrically connected in series with an associated photoconductor 11*a*–11*c*, electroluminescent cells 10*a*–10*c* being connected to grounded terminal 12 of voltage source 14 and photoconductors 11*a*–11*c* being connected to terminal 13 of voltage source 14.

The second set of electroluminescent cells 15*a*, 15*b* and 15*c* are coupled across terminals 12 and 13 by switches X, Y, and Z and are optically coupled to photoconductors 16*a*, 16*b*, and 16*c* respectively. One end of photoconductor 16*a* is connected to the junction between electroluminescent cell 10*a* and photoconductor 11*a*, photoconductors 16*b* and 16*c* being similarly connected to electroluminescent cells 10*b* and 10*c* and photoconductors 11*b* and 11*c* respectively. The other ends of photoconductors 16*a*, 16*b* and 16*c* are coupled through a selector switch 17 to voltage source 14.

Output photoconductors 20*a*, 20*b* and 20*c* are electrically connected in series with a switch 21 between terminal 13 and output terminal 22. Also, photoconductor 20*a* is optically coupled to electroluminescent cells 10*a* and 15*a*, photoconductor 20*b* is optically coupled to electroluminescent cells 10*b* and 15*b*, and photoconductor 20*c* is optically coupled to electroluminescent cells 10*c* and 15*c*. A load 23 is connected between grounded terminal 12 and output terminal 22. If desired, output photoconductors 20*a*–20*c* and load 23 may be energized from a separate voltage source to provide electrical isolation from the rest of the circuits. Also, two photoconductors electrically connected in parallel and each optically coupled to only one electroluminescent cell may be used in place of the single output photoconductors 20*a*–20*c*.

In explaining the operation of the "and" gate it will first be assumed that the circuit has been set to energize load 23 only when switches X, Y and Z are closed. For normal operation, switch 21 is closed and switch 17 is set in the "operate" position thereby disconnecting photoconductors 16*a*, 16*b* and 16*c* from the voltage source. Electroluminescent cells 10*a*, 10*b*, 10*c* are not energized and, therefore, photoconductors 20*a*, 20*b* and 20*c* are in their high impedance states. In order to energize load 23, switches X, Y and Z are all closed connecting voltage source 14 across electroluminescent cells 15*a*, 15*b* and 15*c*. Light from these cells falls upon photoconductors 20*a*, 20*b* and 20*c* energizing load 23 from source 14. If any one of the switches X, Y and Z is not closed, the associated output photoconductors will not be illuminated and the impedance in series with load 23 will be too high to permit current flow.

Assume now that it is desired to modify the circuit so that load 23 will be energized whenever switch X or Z is closed but that the position of switch Y will have no effect on the flow of current through load 23. Switch 17 is first set to the "clear" position and switch 21 is opened to disconnect load 23. Next, all of the switches X, Y and Z are closed energizing electroluminescent cells 15*a*, 15*b* and 15*c* causing photoconductors 16*a*, 16*b* and 16*c* to be illuminated. Illuminating photoconductors 16*a*, 16*b* and 16*c* reduces their impedances and therefore a large percentage of the voltage across terminals 12 and 13 is applied across each of the electroluminescent cells 10*a*, 10*b*, and 10*c*. The light emitted by cells 10*a*, 10*b*, and 10*c* falls upon photoconductors 11*a*, 11*b*, and 11*c* decreasing their impedances and holding cells 10*a*, 10*b*, and 10*c* in their energized state. Light from electroluminescent cells 10*a*, 10*b*, and 10*c* also illuminates output photoconductors 20*a*, 20*b* and 20*c*, but load 23 is not energized since switch 21 is open.

The gate is set to permit load current flow only when switches X and Z have been closed by turning switch 17 to the "set" position and closing input switches X and Z momentarily. Closing switches X and Z energizes electroluminescent cells 15*a* and 15*c* illuminating photoconductors 16*a* and 16*c* respectively. Since photoconductors 16*a* and 16*c* are grounded through the "set" position of switch 17, the voltage across electroluminescent cells 10*a* and 10*c* is reduced to a low value causing them to be extinguished. Photoconductors 11*a* and 11*c* are darkened, their impedances rise, and electroluminescent cells 10*a* and 10*c* remain deenergized. Since input switch Y was not closed, electroluminescent cell 10*b* remains energized through photoconductor 11*b*.

The circuit is now set to receive the new input signal. Switch 21 is closed and switch 17 is turned to the "operate" position. Under these conditions, when switches X and Z are closed, load 22 is energized through the series-connected photoconductors 20*a*, 20*b* and 20*c*.

Figure 2:
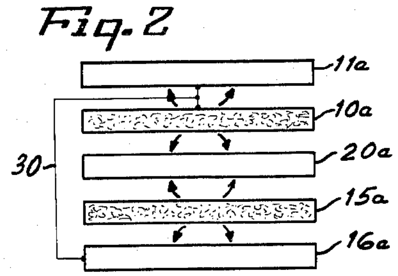
FIG. 2 is a schematic cross-sectional view of one stage of the "and" gate of FIG. 1.

In FIG. 2 there is shown a cross sectional schematic view of one stage of the "and" gate of FIG. 1. The reference numerals assigned to the electroluminescent and photoconductive layers in this figure correspond to the elements in the first stage of FIG. 1. Electroluminescent cells 10*a* and 15*a* are composed of layers of zinc sulfide activated with copper and co-activated with a chloride while photoconductors 11*a*, 20*a* and 16*a* are layers of cadmium sulfide or cadmium selenide. In accordance with known techniques for manufacturing electroluminescent-photoconductive devices, the layers may be deposited upon a glass substrate (not shown) and placed in intimate contact with each other. As shown by the arrows, electroluminescent layer 10*a* is optically coupled to photoconductive layers 11*a* and 20*a*, while electroluminescent layer 15*a* is optically coupled to photoconductive layers 16*a* and 20*a*. Electroluminescent layer 10*a* and photoconductive layer 11*a* are electrically connected together and the junction between these two elements is connected by a lead 30 to photoconductive layer 16*a*.

Figure 3:
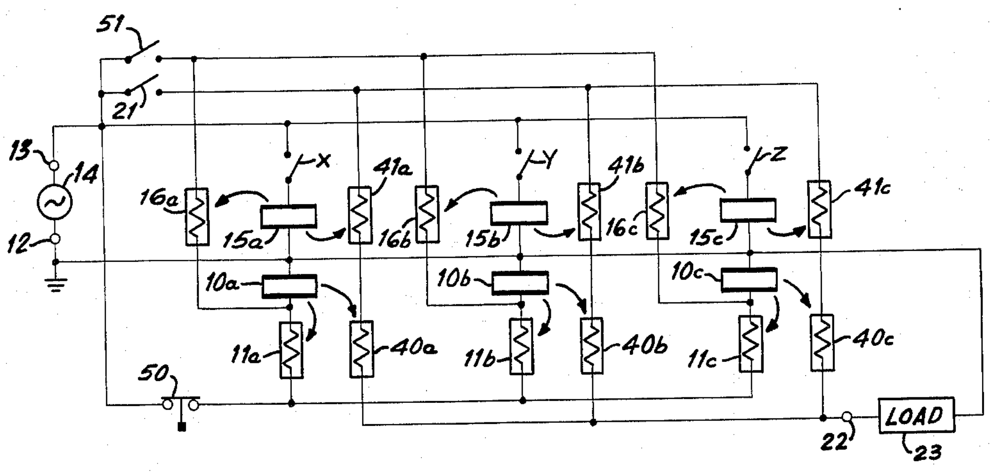
FIG. 3 is a schematic diagram of an "or" gate employing the invention.

In FIG. 3 there is shown an "or" circuit embodying the principles of our invention. This circuit is essentially the same as the "and" gate of FIG. 1, and corresponding components therein are identified by the same numerals as are used in FIG. 1. However, it shall be noted that electroluminescent cells 11*a* and 15*a* are optically coupled to series-connected output photoconductors 40*a* and 41*a* respectively. Similarly, electroluminescent cells 11*b* and 15*b* are optically coupled to series-connected output conductors 40*b* and 41*b* respectively while electroluminescent cells 11*c* and 15*c* are optically coupled to series-connected output conductors 40*c* and 41*c*. Also, the selector switch 17 shown in FIG. 1 is replaced by a normally closed switch 50 and by a single pole-single throw switch 51.

The circuit is set to respond to a predetermined input signal by opening switch 21 and depressing switch 50 thereby deenergizing any of the electroluminescent cells 10a–10c which may have been previously energized. Switch 51 is next closed, connecting photoconductors 16a–16c to terminal 13 of voltage source 14. The selected input switches are then closed momentarily. More particularly, if it is desired to energize the load only when input switch X or Z is closed, these switches are momentarily closed, switch Y remaining open. Momentarily closing switches X and Z energizes electroluminescent cells 15a and 15c illuminating photoconductors 16a, 16c, 14a and 14c. The impedances of illuminated photoconductors 16a–16c decrease and therefore the potential at the junction between electroluminescent cell 10a and photoconductor 11a increases, energizing cell 10a. Similarly, the potential at the junction between electroluminescent cell 10c and photoconductor 11c is raised energizing cell 10c. Light from electroluminescent cells 10a and 10c falls upon photoconductors 11a and 11c, respectively, causing cells 10a and 10c to remain energized and illuminate output photoconductors 40a and 40c. Switch 51 is next opened and switch 21 is closed. Now, when either switch X or Z is closed, the load is energized either through the path consisting of photoconductors 40a and 41a or the path consisting of photoconductors 40c and 41c. Closing switch Y will have no effect on the load, because the high impedance of darkened photoconductor 40b is in series with photoconductor 41b.

Figure 4:
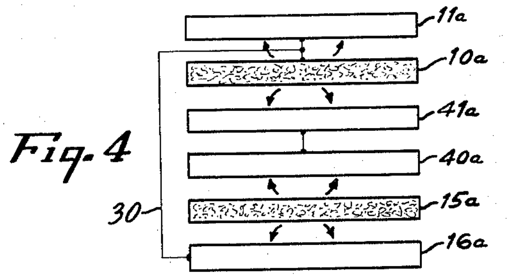
FIG. 4 is a schematic cross-sectional view of one stage of the "or" gate of FIG. 3.

FIG. 4 shows one stage of the "or" gate of FIG. 3. This figure is essentially the same as FIG. 2 except that two series-connected photoconductors 40a and 41a replace photoconductor 20a.

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. A logic circuit comprising first and second terminals adapted for coupling to an applied voltage source; a plurality of logic stages, each of said stages including a first voltage responsive light emitting element, a first photoconductive element optically coupled to said first light emitting element, said first light emitting element and said first photoconductive element being electrically coupled in series across said first and second terminals, a second voltage responsive light emitting element, input switching means for coupling said second light emitting element directly across said first and second terminals, a second photoconductive element optically coupled to said second light emitting element, said second photoconductive element having one end electrically connected in circuit between said first light emitting element and said first photoconductive element, means for selectively coupling the other end of said second photoconductive element to said voltage source, and output photoconductive means optically coupled to said first and second light emitting elements.

2. A logic circuit comprising first, second and third terminals; a plurality of logic stages, each of said stages including a first electroluminescent element, a first photoconductive element optically coupled to said first electroluminescent element, said first electroluminescent element and said first photoconductive element being electrically coupled in series across said first and second terminals, a second electroluminescent element, input switching means for coupling said second electroluminescent element directly across said first and second terminals, a second photoconductive element optically coupled to said second electroluminescent element, said second photoconductive element having one end electrically connected in circuit between said first electroluminescent element and said first photoconductive element, means for selectively coupling the other end of said second photoconductive element to said first terminal; and output photoconductive means optically coupled to said first and second electroluminescent elements, said output photoconductive means being electrically coupled between said first and third terminals.

3. A logic circuit comprising first and second terminals adapted for coupling to an applied voltage source; a plurality of logic stages, each of said stages including a first voltage responsive light emitting element, a first photoconductive element optically coupled to said first light emitting element, said first light emitting element and said first photoconductive element being electrically coupled in series across said first and second terminals, a second voltage responsive light emitting element, input switching means for coupling said second light emitting element directly across said first and second terminals, a second photoconductive element optically coupled to said second light emitting element, said second photoconductive element having one end electrically connected in circuit between said first light emitting element and said first photoconductive element, means for selectively deenergizing said first electroluminescent element, means for selectively coupling the other end of said second photoconductive element to said voltage source, and output photoconductive means optically coupled to said first and second light emitting elements.

4. A logic circuit comprising first and second terminals adapted for coupling to an applied voltage source; a plurality of logic stages, each of said stages including a first voltage responsive light emitting element, a first photoconductive element optically coupled to said first light emitting element, said first light emitting element and said first photoconductive element being electrically coupled in series across said first and second terminals, a second voltage responsive light emitting element, input switching means for coupling said second light emitting element directly across said first and second terminals, a second photoconductive element optically coupled to said second light emitting element, said second photoconductive element having one end electrically connected in circuit between said first light emitting element and said first photoconductive element, means for selectively deenergizing said first electroluminescent element, an output photoconductive element optically coupled to said first and second electroluminescent elements; and means electrically connecting the output photoconductive elements in each stage in series between said first and third terminals.

5. A logic circuit comprising first and second terminals adapted for coupling to an applied voltage source; a plurality of logic stages, each of said stages including a first voltage responsive light emitting element, a first photoconductive element optically coupled to said first light emitting element, said first light emitting element and said first photoconductive element being electrically coupled in series across said first and second terminals, a second voltage responsive light emitting element, input switching means for coupling said second light emitting element directly across said first and second terminals, a second photoconductive element optically coupled to said second light emitting element, said second photoconductive element having one end electrically connected in circuit between said first light emitting element and said first photoconductive element, means for selectively deenergizing said first electroluminescent element, and first and second output photoconductive elements optically coupled to said first and second electroluminescent elements respectively, said first and second output photoconductive elements being electrically connected in series between said first and third terminals.

6. A logic circuit comprising, first, second and third terminals, said first and second terminals being adapted for coupling to an applied voltage source; a plurality of logic stages, each of said stages including a first electroluminescent element, a first photoconductive element optically coupled to said first electroluminescent element, said first electroluminescent element and said first photoconductive element being electrically coupled in series across said first and second terminals, a second electroluminescent element, input switching means for coupling said second electroluminescent element directly across said first and second terminals, a second photoconductive element optically coupled to said second electroluminescent element, said second photoconductive element having one end electrically connected in circuit between said first electroluminescent element and said first photoconductive element, and an output photoconductive element optically coupled to said first and second electroluminescent elements; a selector switch having a common terminal and first, second, and third selectable positions, said selector switch connecting the other end of each of said second photoconductive elements to said first terminal when in its first position, disconnecting the other end of said second photoconductive elements when in their second position, and connecting the other end of said second photoconductive elements to said second terminal when in their third position; and means electrically connecting the output photoconductive element in each stage in series between said first and third terminals.

7. A logic circuit comprising first, second, and third terminals, said first and second terminals being adapted for coupling to an applied voltage source; a plurality of logic stages, each of said stages including a first electroluminescent element, a first photoconductive element optically coupled to said first electroluminescent element, said first electroluminescent element and said first photoconductive element being electrically coupled in series across said first and second terminals, a second electroluminescent element, input switching means for coupling said second electroluminescent element across said first and second terminals, a second photoconductive element directly optically coupled to said second electroluminescent element, said second photoconductive element having one end electrically connected in circuit between said first electroluminescent element and said first photoconductive element, and first and second output photoconductive elements optically coupled to said first and second electroluminescent elements respectively, said first and second output photoconductive elements being electrically connected in series with said first and third terminals; a first switch for selectively connecting the other end of each of said second photoconductive elements to said first terminal; and a second switch for deenergizing said first electroluminescent element.

References Cited by the Examiner

UNITED STATES PATENTS

| | | | |
|---|---|---|---|
| 2,952,792 | 9/60 | Yhap | 313—108 |
| 2,975,290 | 2/61 | Spitzer | 313—108 |
| 2,985,763 | 5/61 | Ress | 250—213 X |
| 3,152,258 | 10/64 | Heetman | 250—213 |

RALPH G. NILSON, *Primary Examiner.*

GEORGE N. WESTBY, *Examiner.*